US009719867B2

United States Patent
Sharratt et al.

(10) Patent No.: US 9,719,867 B2
(45) Date of Patent: Aug. 1, 2017

(54) METHOD AND SYSTEM FOR MEASURING HEAT FLUX

(71) Applicant: KLA-Tencor Corporation, Milpitas, CA (US)

(72) Inventors: Stephen Sharratt, Mountain View, CA (US); Farhat Quli, Hayward, CA (US); Earl Jensen, Santa Clara, CA (US); Mei Sun, Los Altos, CA (US)

(73) Assignee: KLA-Tencor Corporation, Milpitas, CA (US)

( * ) Notice: Subject to any disclaimer, the term of this patent is extended or adjusted under 35 U.S.C. 154(b) by 455 days.

(21) Appl. No.: 14/290,255

(22) Filed: May 29, 2014

(65) Prior Publication Data

US 2014/0355643 A1    Dec. 4, 2014

Related U.S. Application Data

(60) Provisional application No. 61/829,138, filed on May 30, 2013.

(51) Int. Cl.
G01K 17/00    (2006.01)
G01K 19/00    (2006.01)

(52) U.S. Cl.
CPC ............ G01K 19/00 (2013.01); G01K 17/00 (2013.01)

(58) Field of Classification Search
CPC ........................................................ G01K 17/00
USPC .................................................. 374/30, 112
See application file for complete search history.

(56) References Cited

U.S. PATENT DOCUMENTS

| 4,812,050 A * | 3/1989 | Epstein ................. G01K 17/20 250/252.1 |
| 5,444,637 A | 8/1995 | Smesny et al. |
| 5,746,513 A | 5/1998 | Renken |
| 5,775,808 A | 7/1998 | Pan |
| 6,190,040 B1 | 2/2001 | Renken et al. |
| 6,325,536 B1 | 12/2001 | Renken et al. |
| 6,472,240 B2 * | 10/2002 | Akram .................. G01K 1/026 257/E21.53 |
| 6,616,332 B1 | 9/2003 | Renken et al. |
| 6,691,068 B1 | 2/2004 | Freed et al. |

(Continued)

FOREIGN PATENT DOCUMENTS

JP    2005340291 A  * 12/2005

OTHER PUBLICATIONS

PCT Search Report, International Application No. PCT/US2014/040002, Mail Date Jan. 29, 2015.

*Primary Examiner* — Clayton E LaBalle
*Assistant Examiner* — Leon W Rhodes, Jr.
(74) *Attorney, Agent, or Firm* — Suiter Swantz pc llo

(57) ABSTRACT

A heat flux sensor equipped measurement wafer includes a substrate, a cover thermally coupled to a portion of the substrate, a sensor cavity formed between the substrate and the cover, a thermal barrier disposed within at least a portion of the sensor cavity, a bottom temperature sensor thermally coupled to the substrate and insulated from the cover by a portion of the thermal barrier and a top temperature sensor thermally coupled to the cover and insulated from the substrate by an additional portion of the thermal barrier, wherein a temperature difference between the bottom temperature sensor and the top temperature sensor is related to a heat flux passing through the substrate and cover proximate to the sensor cavity.

25 Claims, 9 Drawing Sheets

(56) References Cited

U.S. PATENT DOCUMENTS

| | | |
|---|---|---|
| 6,907,364 B2 | 6/2005 | Poolla et al. |
| 6,945,691 B2 * | 9/2005 | Trapasso .................. G01K 1/14 |
| | | 374/1 |
| 7,192,505 B2 | 3/2007 | Roche et al. |
| 7,299,148 B2 | 11/2007 | Hunt et al. |
| 7,419,299 B2 | 9/2008 | Akram et al. |
| 7,482,576 B2 | 1/2009 | Mundt et al. |
| 7,495,542 B2 * | 2/2009 | Saio ....................... G01K 1/026 |
| | | 338/25 |
| 7,692,148 B2 | 4/2010 | Lane et al. |
| 8,033,190 B2 | 10/2011 | Renken et al. |
| 8,523,427 B2 | 9/2013 | Pillans |
| 2004/0107066 A1 | 6/2004 | Poolla et al. |
| 2011/0174777 A1 | 7/2011 | Jensen et al. |
| 2012/0203495 A1 | 8/2012 | Sun et al. |
| 2014/0192840 A1 | 7/2014 | Sun et al. |

\* cited by examiner

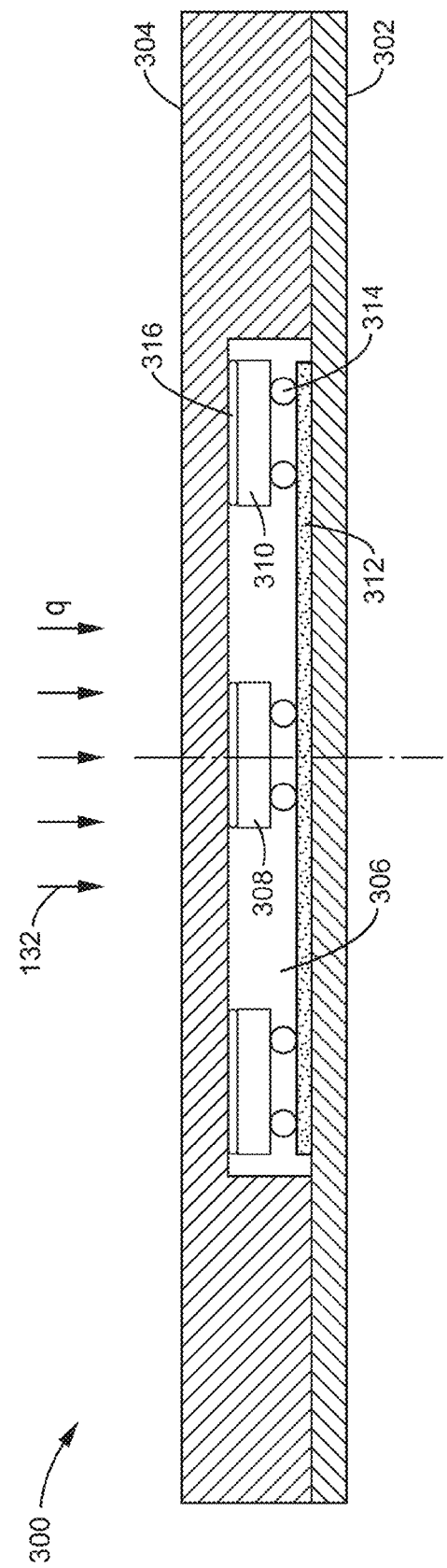

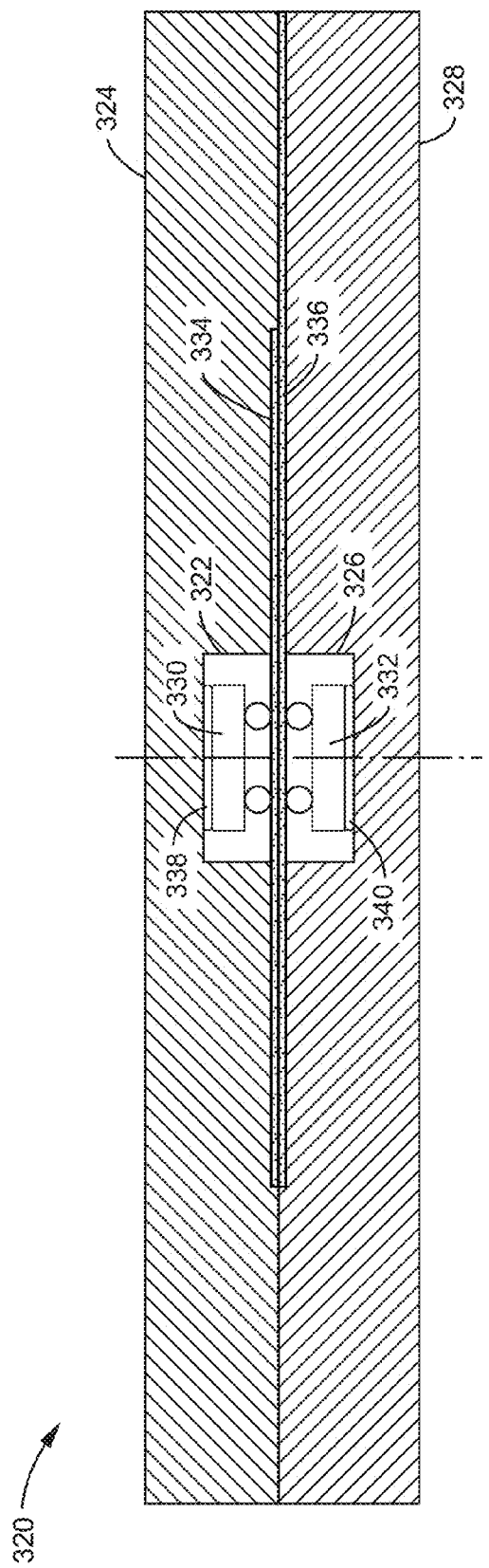

METHOD AND SYSTEM FOR MEASURING HEAT FLUX

CROSS-REFERENCE TO RELATED APPLICATION

The present application is related to and claims the benefit of the earliest available effective filing date(s) from the following listed application(s) (the "Related Applications") (e.g., claims earliest available priority dates for other than provisional patent applications or claims benefits under 35 USC §119(e) for provisional patent applications, for any and all parent, grandparent, great-grandparent, etc. applications of the Related Application(s)).

RELATED APPLICATIONS

For purposes of the USPTO extra-statutory requirements, the present application constitutes a regular (non-provisional) patent application of United States Provisional Patent Application entitled EMBEDDED HEAT FLUX SENSOR USING THERMAL BARRIER, naming Stephen Sharratt, Farhat Quli, Earl Jensen, and Mei Sun as inventors, filed May 30, 2013, Application Ser. No. 61/829,138.

TECHNICAL FIELD

The present invention generally relates to heat flux detection, and more particularly to heat flux detection in using one or more heat flux sensors embedded in a substrate having a thin form factor.

BACKGROUND

As tolerances on process conditions in semiconductor device processing environments continue to narrow, the demand for improved process condition monitoring systems continues to increase. Heat flux within a processing system (e.g., plasma processing system) is one such condition. Previous heat flux sensor systems include temperature sensors embedded in a material placed at known distance from each other (e.g., in the direction of thermal energy flow). Additional designs include individual temperature sensors placed in a ground cavity within a thin package. The cavities are designed to have different thermal resistances such that a temperature difference exists between the sensors within the cavities when an external heat flux is applied. An additional approach to measuring heat flux includes the use of a calibrated thermopile (array of thermocouples) on or within a substrate material and calibrating the thermopile voltage output in relation to a known applied heat flux. Previous methods are difficult to implement in a thin-profile, high thermal conductivity substrate. Typically, embedded heat flux sensors measure a temperature difference in the direction parallel to the thermal energy flow. In a very thin wafer form factor, the direction of thermal energy flow is axial and placing temperature sensors in appropriate axial orientation is difficult. In addition, the high thermal conductivity of the substrate typically results in temperature differences that may be difficult to measure. In addition, thermopiles output a voltage that is proportional to the heat flux across the thermopile. In some instances, this voltage may fall outside the appropriate range for measurement by an electronic measurement system. Therefore, it would be desirable to provide a system and method for curing defects such as those identified above.

SUMMARY

A measurement wafer heat flux sensor is disclosed, in accordance with an illustrative embodiment of the present invention. In one embodiment, the measurement wafer heat flux sensor may include a substrate; a cover thermally coupled to a portion of the substrate; a sensor cavity formed between the substrate and the cover; a thermal barrier disposed within at least a portion of the sensor cavity; a bottom temperature sensor thermally coupled to the substrate and insulated from the cover by a portion of the thermal barrier; and a top temperature sensor thermally coupled to the cover and insulated from the substrate by an additional portion of the thermal barrier. In another embodiment, the temperature difference between the bottom temperature sensor and the top temperature sensor is related to a heat flux passing through the substrate and cover proximate to the sensor cavity.

A heat flux sensing system is disclosed, in accordance with an illustrative embodiment of the present invention. In one embodiment, the heat flux sensing system may include a measurement wafer heat flux sensor. In another embodiment, the measurement wafer heat flux sensor may include a substrate; a cover thermally coupled to a portion of the substrate; a sensor cavity formed between the substrate and the cover; a thermal barrier disposed within at least a portion of the sensor cavity; a bottom temperature sensor thermally coupled to the substrate and insulated from the cover by a portion of the thermal barrier; and a top temperature sensor thermally coupled to the cover and insulated from the substrate by an additional portion of the thermal barrier, wherein a temperature difference between the bottom temperature sensor and the top temperature sensor is related to a heat flux passing through the substrate and cover proximate to the sensor cavity. In another embodiment, the heat flux sensing system may include a controller communicatively coupled to the measurement wafer heat flux sensor, the controller including one or more processors configured to execute a set of program instructions. In another embodiment, the set of program instructions is configured to cause the one or more processors to: receive temperature measurements from the bottom temperature sensor and the top temperature sensor; determine the differential temperature between the top temperature sensor and the bottom temperature sensor; and determine a heat flux passing through the substrate and cover proximate to the sensor cavity based on the differential temperature between the bottom temperature sensor and the top temperature sensor.

A method for measuring heat flux with a measurement wafer is disclosed, in accordance with an illustrative embodiment of the present invention. In one embodiment, the method may include providing a measurement wafer heat flux sensor including at least a bottom temperature sensor thermally coupled to a substrate and insulated from a cover by a portion of the thermal barrier and at least a top temperature sensor thermally coupled to the cover and insulated from the substrate by an additional portion of the thermal barrier, the bottom temperature sensor and the top temperature sensor disposed in a sensor cavity of the measurement wafer heat flux sensor; acquiring temperature measurements from the bottom temperature sensor and the top temperature sensor of the measurement wafer heat flux sensor; determining a differential temperature between the top temperature sensor and the bottom temperature sensor; and determining a heat flux passing through the substrate and cover proximate to the sensor cavity based on the differential temperature between the bottom temperature sensor and the top temperature sensor.

It is to be understood that both the foregoing general description and the following detailed description are exemplary and explanatory only and are not necessarily restrictive of the invention as claimed. The accompanying drawings, which are incorporated in and constitute a part of the specification, illustrate embodiments of the invention and together with the general description, serve to explain the principles of the invention.

BRIEF DESCRIPTION OF THE DRAWINGS

The numerous advantages of the disclosure may be better understood by those skilled in the art by reference to the accompanying figures in which:

FIG. 3A is a cross sectional view of an alternate design of a bridged heat flux sensor, in accordance with an alternative embodiment of the present invention.

FIG. 3B is a cross sectional view of an alternate design of a double level heat flux sensor, in accordance with an alternative embodiment of the present invention.

DETAILED DESCRIPTION OF THE INVENTION

Figure 1A:
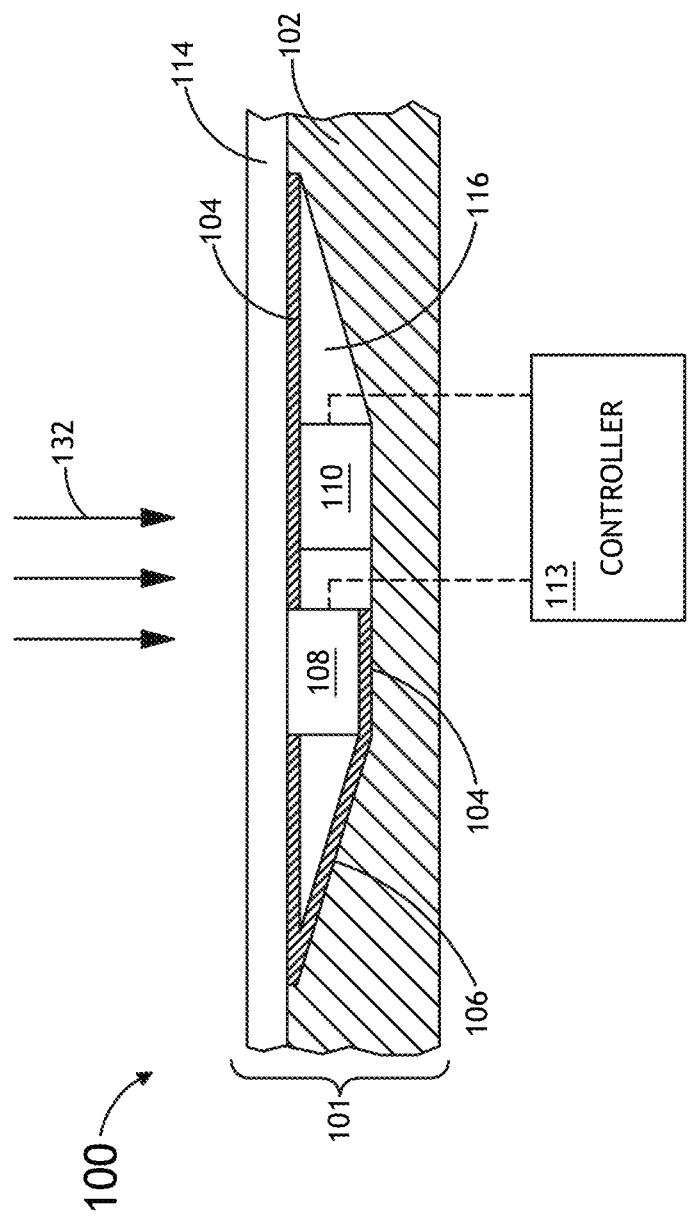
FIG. 1A is a block diagram view of a measurement wafer heat flux sensor including two embedded temperature sensors used to detect and quantify heat flux, in accordance with one embodiment of the present invention.

Reference will now be made in detail to the subject matter disclosed, which is illustrated in the accompanying drawings.

Referring generally to FIGS. 1A through 6, a system and method for measuring heat flux with one or more embedded sensors are described in accordance with the present disclosure.

Embodiments of the present invention may be directed to multiple heat flux sensors built into a substrate, allowing for distributed heat flux measurements carried out in a plasma processing environment by a heat flux sensor system. It is noted herein that one difficulty related to measuring heat flux includes the measurement of heat flux in relatively high thermal conductivity materials, such as silicon. Embodiments of the present invention may be directed to a heat flux sensor system including one or more heat flux sensors (e.g., pairs of temperature sensors) embedded in a thin form factor, high thermal conductivity substrate. Embodiments of the present invention may be further directed to a configuration where two or more temperature sensors of a heat flux sensor are arranged in the same plane perpendicular to the direction of thermal energy flux. Embodiments of the present invention may be further directed to a heat flux sensor system integrated into a sealed unit (e.g., thickness of 0.5-1.5 mm), while conforming to standard wafer processing dimensions (e.g., 100-450 mm). Embodiments of the present disclosure may implement thermally insulated sensor cavities to increase a measured differential temperature, thereby increasing the sensitivity of heat flux measurements. Further, the implementation of multiple heat flux sensors onto a measurement wafer (e.g., substrate and cover) allows for heat flux measurements of a measurement wafer or substrate to be collected and subsequently downloaded. It is further noted that the measurement wafer of the present disclosure may be completely sealed, so as to permit exposure to a variety of conditions, such as, but not limited to, moisture, high energy RF, high temperature, heat flux or any other thermal flux source (e.g., radiation).

Heat flux is typically measured using temperature sensors placed across a spatial distance under steady state conditions. Fourier's law of thermal conduction is then used to calculate the heat flux:

$$q = -kA\frac{dT}{dx}$$

Where q is heat flux, k is the known material thermal conductivity, A is area under conduction, and dT/dx is the temperature gradient in the uniform material under steady state heat flux conditions.

In addition, heat flux may be measured utilizing sensors, which respond in a predictable and well-behaved manner to heat flux. In this regard, the one or more sensors may be calibrated by inputting a known heat flux through the sensor and recording the sensor response at various flux levels.

The measurement of heat flux using one or more heat flux sensors embedded in a substrate is generally described in U.S. patent application Ser. No. 13/020,770 to Mei Sun et al., filed on Feb. 3, 2011, which is incorporated herein by reference in the entirety.

FIG. 1A illustrates a block diagram view of a system 100 for measuring heat flux using two or more embedded temperature sensors, in accordance with an embodiment of the present invention. In one embodiment, the system 100 includes a measurement wafer heat flux sensor 101. In one embodiment, the measurement wafer heat flux sensor 101 includes a heat flux sensor (e.g., pair of temperature sensors) disposed within a measurement wafer structure, as shown in FIG. 1A. In another embodiment, the measurement wafer heat flux sensor 101 may include a substrate 102 (e.g., substrate wafer). For example, the substrate 102 may include, but is not limited to, a semiconductor substrate, a glass substrate and the like.

In one embodiment, the substrate wafer 102 includes a sensor cavity 116. For example, the sensor cavity 116 may include a recessed portion suitable for containing a first sensor 108 (or "top" temperature sensor) and a second sensor 110 (or "bottom" temperature sensor), as shown in FIG. 1A. The sensor cavity 116 may be formed by any wafer processing procedure known in the art. For example, the process used to form the sensory cavity 116 may include, but is not limited to, a mechanical grinding process, an etching process or a laser machining process.

In another embodiment, the top sensor 108 and bottom sensor 110 are temperature sensors disposed within the sensor cavity 116 and suitable for measuring a temperature difference (i.e., differential temperature) between the top and bottom sensors 108, 110.

In another embodiment, the measurement wafer 101 may include a cover 114 (e.g., cover wafer). For example, the cover 114 may be attachable to the top surface of the substrate 102.

In another embodiment, a thermal barrier material 104 is disposed on a portion of the substrate wafer 102, which serves as a mounting surface for the thermal barrier material 104. In one embodiment, the bottom temperature sensor 110 is thermally coupled to the substrate 102 and insulated from the cover 114 by a portion of the thermal barrier 106. In another embodiment, the top temperature sensor 108 is thermally coupled to the cover 114 and insulated from the substrate 102 by an additional portion of the thermal barrier 104. In this regard, since the top temperature sensor 108 is insulated from the substrate 102 and has a high thermal conductivity connection (not shown here) to the cover 114, the temperature readout of the top temperature sensor 108 approximates the local temperature of the cover 114. Similarly, since the bottom sensor 110 is insulated from the cover 114 and has a high thermal conductivity connection (not shown here) to the substrate 102, the temperature readout of the bottom temperature sensor 110 approximates the local temperature of the substrate 102.

It is noted herein that the usage of the terms "top" and "bottom" is merely provided for purposes of descriptive convenience and should not be interpreted as limiting, as the temperature sensors 108,110 may alternatively be generally referred to herein as descriptively as "first" and "second" temperature sensors. It is further noted that for the purposes of the present disclosure the arrangement of two or more temperature sensors (e.g., top temperature sensor 108 and bottom temperature sensor 110) within a given sensor cavity 116 may be referred to herein as a 'heat flux sensor.'

It is noted herein that the thermal barrier material 104 may include any suitable insulating material known in the art. For example, the thermal barrier material 104 may include, but is not limited to, an insulating plate. By way of another example, the thermal barrier material 104 may include, but is not limited to, an insulating film (e.g., a polyimide film).

It is noted herein that a temperature difference between the bottom temperature sensor 110 and the top temperature sensor 108 is related to a heat flux passing through the substrate 102 and cover 114 proximate to the sensor cavity 116. In one embodiment, the measurement wafer heat flux sensor 101 may utilize temperature measurements from both the top temperature sensor 108 and the bottom temperature sensor 110, which are located perpendicular to the direction of thermal energy flow, or heat flux 132.

In one embodiment, the top sensor 108 may be located on a downward sloping extension 106 of the material such that the top portion of the top sensor 108 is substantially positioned on the same plane as the top of the thermal barrier material 104. For example, the thermal barrier material 104 may be structured or cut in such a way that a portion (e.g., tab 106) of the thermal barrier passes below a top temperature sensor 108, while an additional portion of the thermal barrier 104 is positioned above bottom temperature sensor 110.

In one embodiment, the thermal barrier 104 may consist of multiple shapes in order to fit different locations of the substrate 102. The thermal barrier 104 may have any suitable shape known in the art. For example, the thermal barrier 104 may be shaped as one or more of a circle, a rectangle, a triangle, an oval, and the like.

It is noted herein that the thermal barrier 104 acts to amplify the temperature difference between the top and bottom of the wafer 101. In one embodiment, the resulting temperature difference is approximately proportional to the area of the thermal barrier material 104. In another embodiment, the temperature difference is approximately directly proportional to the thickness of the cover 114. It is noted herein that a thinner cover 114 may result in a larger thermal resistance around which the thermal energy must flow, which, in turn, results in a larger temperature difference than for a thicker cover 114. As such, the thickness of the cover 114 may be tuned in order control the temperature difference response between the top temperature sensor 108 and the bottom temperature sensor 110.

In one embodiment, the measurement wafer heat flux sensor 101 may measure the impinging heat flux passing perpendicularly through the substrate 102, while being processed in a plasma processing chamber. For example, the plasma processing chamber (not shown) may operate with radio frequency (RF) power levels from approximately ≤0.1 W/cm$^2$ to ≥10 KW/cm$^2$. An expected range of heat flux impinging on the wafer can be anywhere between approximately 0.1 W/cm$^2$ to 10 W/cm$^2$. It is further noted that the measurement wafer may include a single heat flux sensor (i.e., a single pair of temperature sensors) or multiple heat flux sensors (i.e., multiple pairs of temperature sensors). It the case where the measurement wafer 101 includes multiple heat flux sensors the sensors may be distributed about the substrate 102 in individual sensor cavities (or multiple sensors in a single cavity).

In another embodiment, the measurement wafer heat flux sensor 101 may fit within a thin form factor package as a result of placing the temperature sensors in the substrate 102 perpendicular to the direction of thermal energy flow 132. It is noted herein that the sensor wafer 101 is designed to mimic a wafer typically used in a plasma processing chamber within the semiconductor industry in order to provide insight as to the heat flux passing through the wafer 101 due to various heating conditions (e.g., RF heating conditions) within the plasma processing chamber.

In another embodiment, the system 100 includes a controller 113. In one embodiment, controller 113 is communicatively coupled to the measurement wafer heat sensor 101. In one embodiment, the controller 113 includes one or more processors (not shown). In another embodiment, the one or more processors are configured to execute a set of program instructions configured to cause the one or more processors to carry out one or more of the various steps described throughout the present disclosure. In another embodiment, the controller 113 may include a non-transitory medium (e.g., memory medium) for storing the program instructions. In one embodiment, the controller 113 may receive temperature measurements from the bottom temperature sensor 110 and the top temperature sensor 108. In another embodiment, the controller 113 may determine the differential temperature between the top temperature sensor 108 and the bottom temperature sensor 110. In another embodiment, the controller 113 may determine a heat flux passing through the substrate 102 and cover 114 proximate to the sensor cavity 116 based on the differential temperature between the bottom temperature sensor 110 and the top temperature sensor 108. In another embodiment, the controller 113 may carry out a heat flux calibration for the measurement wafer heat flux sensor 101, whereby a known heat flux is applied to the sensor 101 and the resulting temperature difference is recorded.

In another embodiment, the controller 113 may apply one or more heat flux calibration factors to the differential temperature to determine the heat flux passing through the substrate 102 and cover 114 proximate to the sensor cavity 116.

For the purposes of the present disclosure, the term 'processor' may be broadly defined to encompass any device having one or more processors or logic elements, which execute instructions from a memory medium. In this sense, the one or more processors of controller 113 may include any microprocessor-type device configured to execute software algorithms and/or instructions. In one embodiment, the one or more processors are positioned external to the measurement wafer heat flux sensor 101. In one embodiment, the one or more processors may consist of a desktop computer or other computer system (e.g., networked computer) configured to execute a program configured to operate the system 100, as described throughout the present disclosure. It should be recognized that the steps described throughout the present disclosure may be carried out by a single computer system or, alternatively, multiple computer systems. In another embodiment, the one or more processors of controller 113 may reside onboard the measurement wafer heat flux sensor 101. In this regard, temperature data obtained using the top sensor 108 and the bottom sensor 110 may be stored in a memory medium disposed onboard the measurement wafer heat flux sensor 101. Further, the one or more onboard processors of controller 113 may retrieve the temperature data from the onboard memory and carry out any one of the various processing steps described throughout the present disclosure. The memory medium may include a read-only memory, a random access memory, a magnetic or optical disk, a solid state drive, flash, EPROM, EEPROM, a magnetic tape, or the like. In another embodiment, the controller 113 may consist of a 'system on a chip.' In this regard, the controller 113 may include a number of combined general processing components. For example, the system on a chip may include, but is not limited to, an internal clock, processor, flash memory cells for storing the processing conditions and other instructions necessary for the operation of the system 100.

Figure 1B:
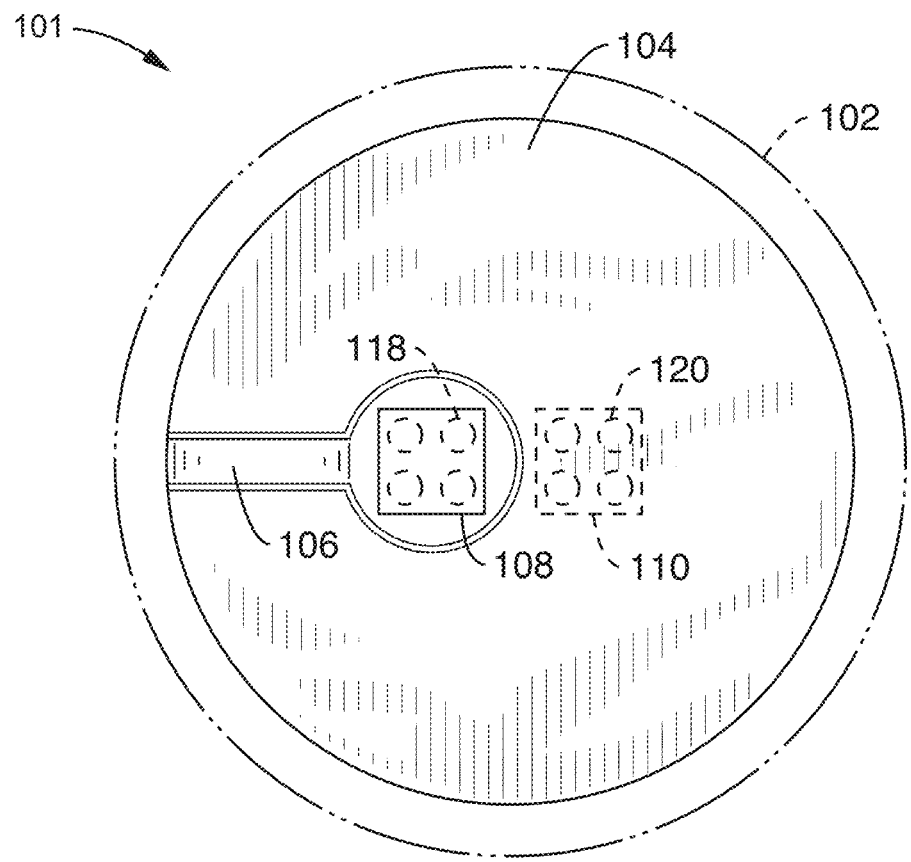
FIG. 1B is a top view of a measurement wafer heat flux sensor including two embedded temperature sensors used to detect and quantify heat flux, in accordance with one embodiment of the present invention.
Figure 1C:
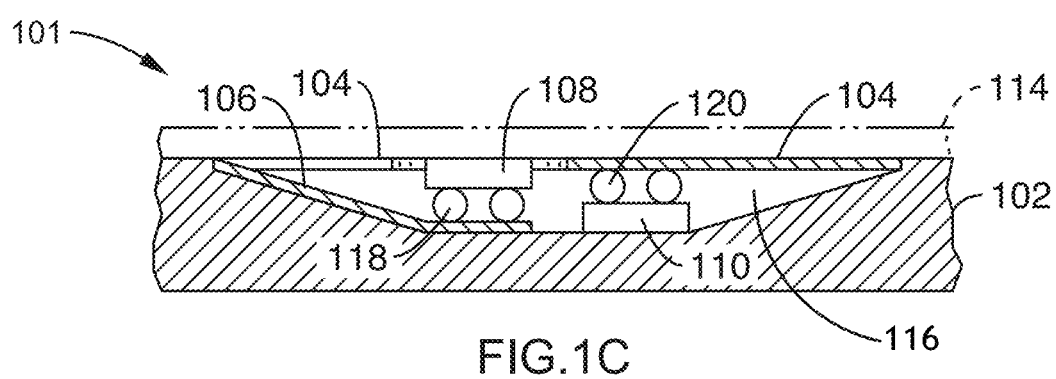
FIG. 1C is a cross sectional view of a measurement wafer heat flux sensor including two embedded temperature sensors used to detect and quantify heat flux, in accordance with one embodiment of the present invention.
Figure 1D:
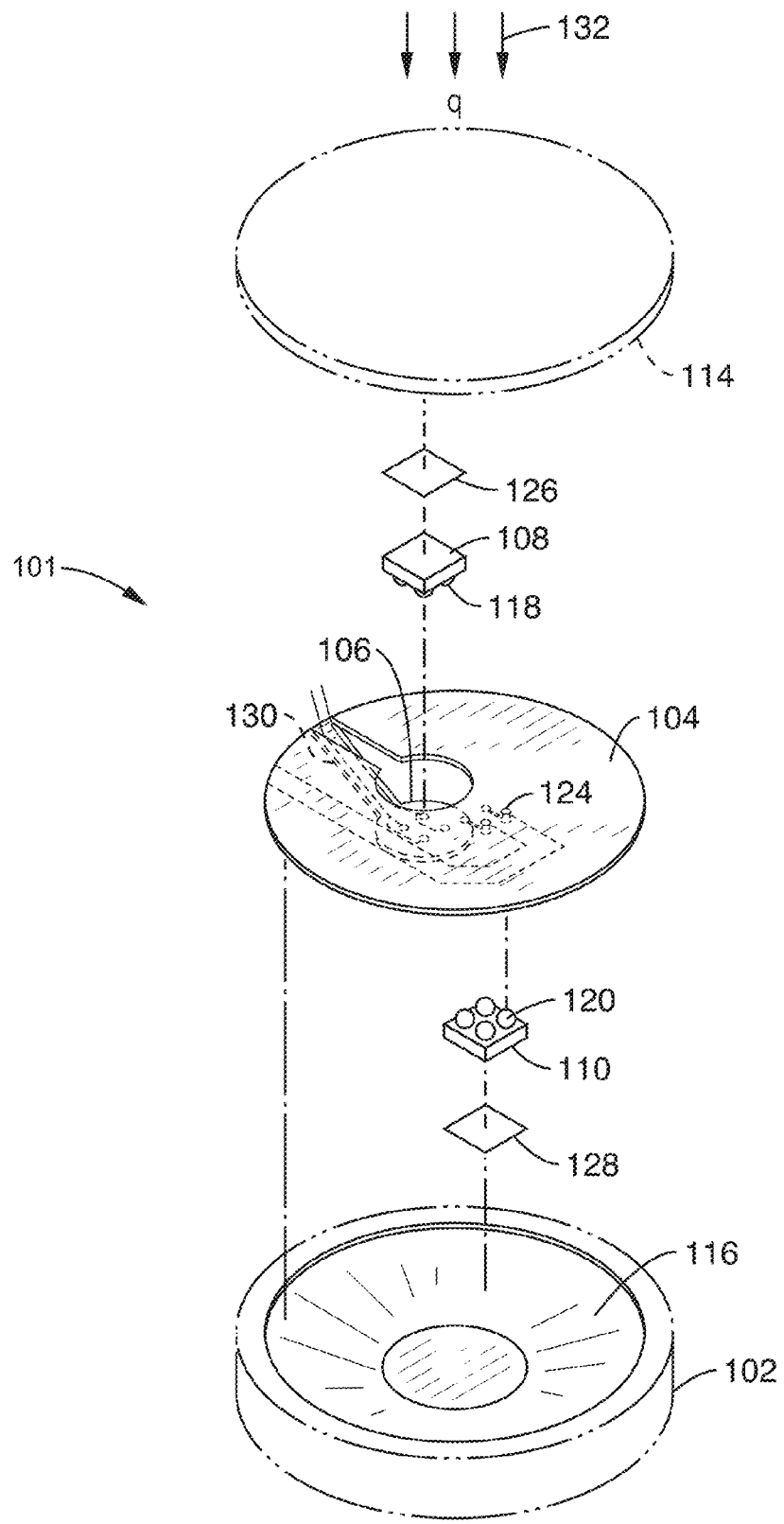
FIG. 1D is an exploded view of a measurement wafer heat flux sensor including two embedded temperature sensors used to detect and quantify heat flux, in accordance with one embodiment of the present invention.

In one embodiment, the communicative coupling between the controller 113 and the measurement wafer heat sensor 101 may be established via one or more sensor circuits (see FIG. 1D). In one embodiment, the one or more sensor circuits may include one or more electrical traces between the top temperature sensor 108 and the bottom temperature sensor 110 and the processors of controller 113. In one embodiment, the one or more sensor circuits may include a flexible circuit formed within the thermal barrier 104. For example, a flexible printed circuit may be formed on/in the thermal barrier 104. For instance, the flexible printed circuit may include any suitable flexible material, such as polyimide, and may include any suitable conductive material, such as aluminum or copper.

In another embodiment, a number of components may be integrated to form the measurement wafer heat flux sensor 101. In one embodiment, a number of individual heat flux sensors (made up of differential temperature sensors as described herein) are distributed about the substrate 102 or cover 114 of the sensor 101. In this regard, the constituent individual heat sensors of the measurement wafer heat flux sensor 101 are capable of detecting gradients in various processing conditions across the surface of the substrate 102.

In one embodiment, the controller 113 may be located on a portion of at least one of the substrate 102 or cover 104. In this regard, the controller 113 is located "onboard" the measurement wafer 101. In another embodiment, the one or more sensor circuits, as discussed further herein, may establish a communication coupling between the top temperature sensor 108, the bottom temperature sensor 110 and the onboard controller 113 (e.g. processors of controller).

In another embodiment, the controller 113 may be located at a position remote to the substrate 102 or cover 114. In this regard, the controller 113 is located "offboard" the measurement wafer 101. In another embodiment, the one or more sensor circuits, as discussed further herein, may establish a communication coupling between the top temperature sensor 108, the bottom temperature sensor 110 and the offboard controller 113 (e.g. processors of controller).

In one embodiment, the measurement wafer heat flux sensor 101 may be utilized in a system sensing package designed to measure the conditions within a plasma processing chamber. In this regard, the incident heat flux on the substrate 102 surface may be provided by a plasma chamber utilized in the semiconductor industry. For example, the measurement wafer heat flux sensor 101 may include multiple individual heat flux sensors (e.g., multiple pairs of temperature sensors) located at various locations across the substrate 102. The resulting heat flux sensor response may then be recorded by the controller 113 and memory combination on sensor 101 or transmitted in real time to an off-wafer data acquisition system via wired or wireless transmission.

FIGS. 1B and 1C illustrate schematic views of the measurement wafer heat flux sensor 101, in accordance with an embodiment of the present invention. FIG. 1B illustrates a top view of the measurement wafer heat flux sensor 101 (with cover 114 removed), in accordance with an embodiment of the present invention. FIG. 1C illustrates a cross-sectional view of the measurement wafer heat flux sensor 101, in accordance with an embodiment of the present invention. As shown in FIGS. 1B and 1C, two or more temperature sensors 108 and 110 are embedded in the substrate 102. In one embodiment, the substrate 102 again may serve as a mount for the thermal barrier material 104. In another embodiment, the thermal barrier material 104 is cut in such a way that a tab 106 of thermal barrier material passes below a top temperature sensor 108. For example, as shown in FIG. 1B, the tab 106 may consist of a composite shape including a circle and rectangle. It is noted that the shape of the tab 106 provided in FIG. 1B is not limiting and is provided merely for illustrative purposes. As shown in FIG. 1C, the remainder of the thermal barrier material 104 may be located above a bottom temperature sensor 110.

In one embodiment, the sensor cavity 116 may have a substantially truncated conical shape, as shown in FIGS. 1B and 1C. It is noted herein that the shape depicted in FIGS. 1B and 1C is not limiting and is provided merely for illustrative purposes. The sensor cavity may take on any shape known in the art. For example, the sensor cavity 116 may have a shape including, but not limited to, a truncated conic section, a cuboid, a cylinder (e.g., shallow cylinder), a prism (e.g., triangular prism, a hexagonal prism and the like) and similar shapes.

In another embodiment, the top temperature sensor 108 may be connected to the thermal barrier 104 via solder bumps 118. In another embodiment, the bottom temperature sensor 110 may be connected to the thermal barrier 104 via solder bumps 120. In another embodiment, the top temperature sensor 108 may be connected to the one or more sensor circuits (e.g., electrical traces) via solder bumps 118. In another embodiment, the bottom temperature sensor 110 may be connected to one or more sensor circuits via solder bumps 120. In other embodiments, the top temperature sensor 108 and/or the bottom temperature sensor 110 may be coupled to the thermal barrier 104 and/or the one or more sensor circuits using any attachment technique known in the art. For example, the top temperature sensor 108 and/or the bottom temperature sensor 110 may be coupled to the thermal barrier 104 and/or the one or more sensor circuits using solder bumps 120, wire bonding, or other die attachment techniques.

FIG. 1D illustrates an assembly view of a measurement wafer heat flux sensor 101, in accordance with an embodiment of the present invention.

In one embodiment, the thermal barrier 104 may include a single or multilayered film or plate. For example, the thermal barrier 104 may include, but is not limited to, a flexible circuit (e.g., double sided polyimide flex circuit). In this regard, the thermal barrier 104 described in FIG. 1D acts as both a thermal barrier material and a flexible printed circuit, whereby temperature differences between the top wafer cover 114 and bottom of the substrate 102 material are created due to an input heat flux 132.

In another embodiment, the thermal barrier 104 may include, but is not required to include, through-hole connections 124, allowing power and signal lines connecting to the bottom temperature sensor 110 to be routed on the same surface as the electrical connections to the top temperature sensor 108.

In another embodiment, after the top temperature sensor 108 and the bottom temperature sensor 110 have been connected (e.g., soldered) to associated mounting tabs on the thermal barrier 104, a thermal connection may be made to the cover 114 and the substrate 102. In one embodiment, a top thermal connection 126 serves to thermally connect the top temperature sensor 108 to the cover 114. In another embodiment, a bottom thermal connection 128 serves to connect the bottom temperature sensor 110 to the substrate 102 at a bottom of the sensor cavity 116. It is recognized herein that the thermal connections in the heat flux sensor 101 may be formed by any highly thermal conductive material known in the art.

It is noted herein that the thermal sensors 108, 110 of the present invention may include any thermal sensor known in the art. For example, the thermal sensors 108, 110 may include, but are not limited to, a surface mounted device (SMD) thermal sensor. It is further noted that although the traces 130 shown in FIG. 1D depict separate electrical power and electrical signal lines to the top temperature sensor 108 and the bottom temperature sensor 110, this should not be interpreted as a limitation. It is recognized herein that the sensors 108, 110 may be connected such that they provide a single output differential temperature signal with common electrical power.

Figure 2:
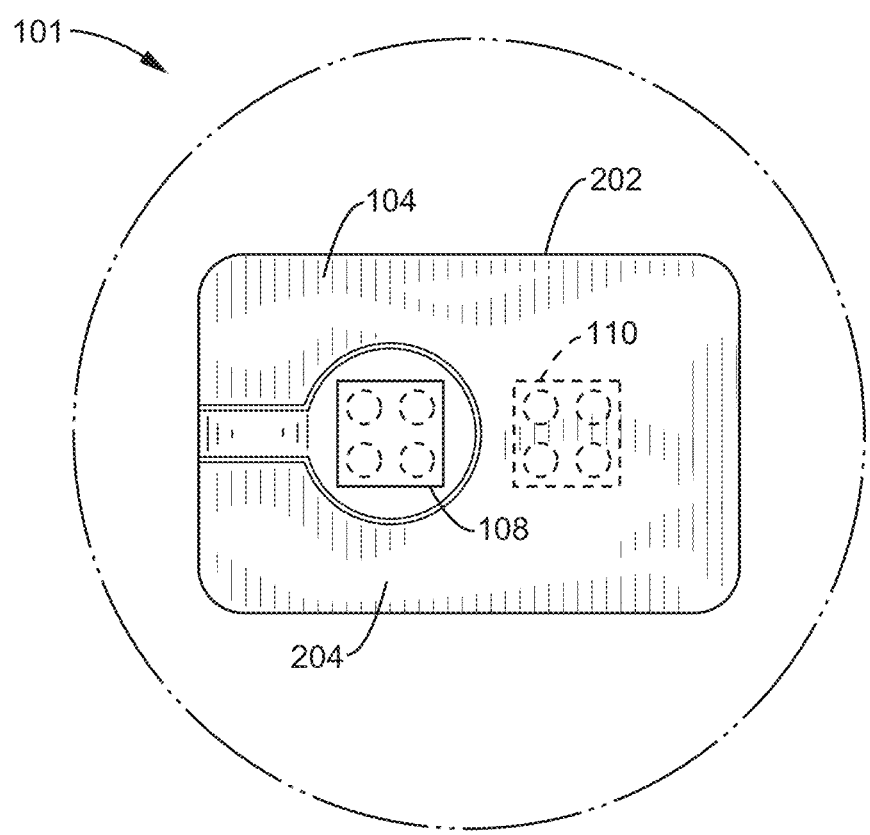
FIG. 2 is a top view of a measurement wafer heat flux sensor including two embedded temperature sensors used to detect and quantify heat flux, in accordance with an alternative embodiment of the present invention.

FIG. 2 illustrates a top view of measurement wafer heat flux sensor 101 having a rounded rectangular sensor cavity 202, in accordance with an alternative embodiment of the present invention. In one embodiment, the top sensor 108 and the bottom sensor 110 are coupled to a rectangular shaped thermal barrier 204. In another embodiment, the rectangular shaped thermal barrier 204 is placed in the recessed portion of the sensor cavity 202. It is noted herein that the sensory cavity 202 and thermal barrier 204 of FIG. 2 should not be interpreted as limiting, but are provided merely for illustrative purposes. It is again noted that the sensor cavity 202 and the thermal barrier 204 of the heat flux sensor 101 may take on any shape known in the art. It is further noted that the components and embodiments described previously herein should be interpreted to extend to the rectangular sensor cavity 202 and rectangular thermal barrier 204 depicted in FIG. 2.

While the heat flux sensor 101 described previously herein in FIG. 1A through FIG. 2 use two temperature sensors located on a single thermal barrier, it is recognized that this is not a limitation on the present invention. In one alternative embodiment, the temperature sensors may be mounted on separate pieces of thermal barrier material 104. In another embodiment, a measurement wafer heat flux sensor 101 may include and utilize more than two temperature sensors. As such, the present invention is not limited to the top temperature sensor 108 and the bottom temperature sensor 110 described previously herein.

FIG. 3A illustrates a cross-sectional view of a bridged heat flux sensor 300, in accordance with an alternative embodiment of the present invention. In one embodiment, a substrate 302 is positioned on the bottom of the device, with a cover 304 containing a sensor cavity 306. In another embodiment, a first sensor 308 is located near the center of the sensor cavity 306 and a second sensor 310 is located near the outer perimeter of the sensor cavity 306. In another embodiment, both sensors are mounted to the flexible printed circuit 312 by solder bumps 314 (but this is not a requirement) and thermally connected to the cover 304 via a thermal connection 316. In another embodiment, the heat flux 132 develops a differential temperature across the cover 304 due to the decreased thermal conductivity of the sensor cavity 306 to the heat flux 132, which extends across the entire surface of the substrate 302.

FIG. 3B illustrates a cross-sectional view of a double level 320 heat flux sensor, in accordance with an alternative embodiment of the present invention. In one embodiment, the cover 324 includes an upper sensor cavity 322 and the substrate 328 includes a lower sensor cavity 326. In another embodiment, the upper temperature sensor 330 is mounted in the upper sensor cavity 322, and a lower temperature sensor 332 is mounted in the lower sensor cavity 326. In another embodiment, electrical connections may be made to flexible printed circuits 334 and 336 through solder bumps (but this is not a requirement). In another embodiment, the thermal connections 338 and 340 are made to the respective cover 324 and substrate 328.

Figure 4:
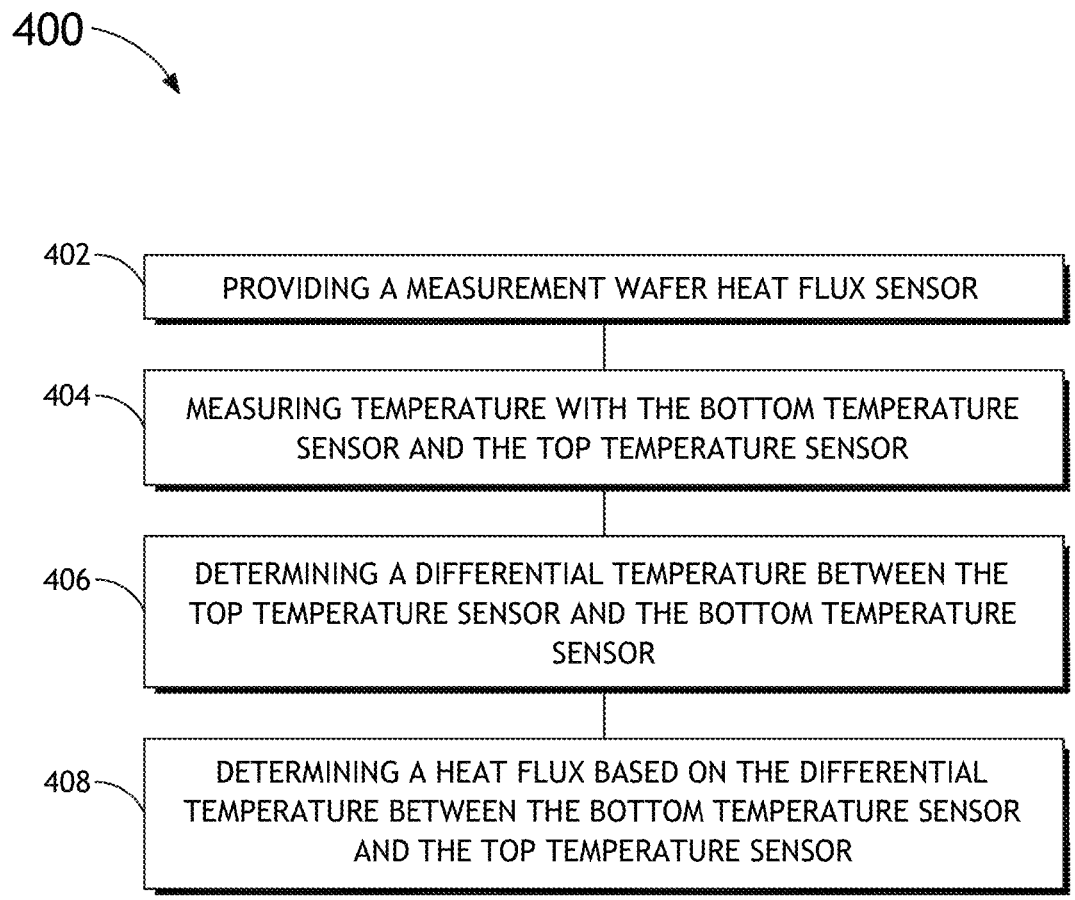
FIG. 4 is a process flow diagram depicting a method for measuring heat flux with a measurement wafer, in accordance with one embodiment of the present invention.

FIG. 4 is a flow diagram illustrating steps performed in a method 400 for measuring heat flux with a measurement wafer. Applicant notes that the embodiments and enabling technologies described previously herein in the context of the systems described previously herein should be interpreted to extend to method 400. It is further noted, however, that the method 400 is not limited to the architecture of the previously described systems.

In a first step 402, a measurement wafer heat flux sensor 101 is provided. In one embodiment, the measurement wafer heat flux sensor 101 includes at least a bottom temperature sensor 110 thermally coupled to a substrate 102 and insulated from a cover 114 by a portion of the thermal barrier 104. In another embodiment, the measurement wafer heat flux sensor 101 includes at least a top temperature sensor 108 thermally coupled to the cover 114 and insulated from the substrate 102 by an additional portion of the thermal barrier 104. In another embodiment, the bottom temperature sensor 110 and the top temperature sensor 108 are disposed in a sensor cavity 116 of the measurement wafer heat flux sensor 101.

In a second step 404, temperature measurements are acquired from the bottom temperature sensor 110 and the top temperature sensor 108 of the measurement wafer heat flux sensor 101. For example, the controller 113 may acquire temperature measurements from the bottom temperature sensor 110 and the top temperature sensor 108 of the measurement wafer heat flux sensor 101.

In a third step 406, a differential temperature between the top temperature sensor 108 and the bottom temperature sensor 110 is determined. In one embodiment, a differential temperature is determined utilizing measurement results from the top temperature sensor 108 and the bottom temperature sensor 110. For example, the controller 113 may calculate a differential temperature based on the measurement results from the top temperature sensor 108 and the bottom temperature sensor 110.

In a fourth step 408, a heat flux passing through the substrate 102 and cover 114 proximate to the sensor cavity 116 is determined based on the differential temperature between the bottom temperature sensor 110 and the top temperature sensor 108. For example, the controller 113 may calculate a heat flux based on the differential temperature between the bottom temperature sensor 110 and the top temperature sensor 108.

In another embodiment, the method 400 may further includes a step of determining one or more heat flux calibration factors. In another embodiment, the method 400 may include isothermally calibrating the top temperature sensor 108 and the bottom temperature sensor 110 within a thermal calibration range to form one or more sensor calibrations for the measurement wafer heat flux sensor 101. In another embodiment, the method 400 may include applying the one or more sensor calibrations to temperatures detected from the bottom temperature sensor 110 and top temperature sensor 108 to form one or more heat flux calibration factors. In another embodiment, the method 400 may include applying the one or more heat flux calibration factors to the differential temperature to determine the heat flux passing through the substrate 102 and cover 114 proximate to the sensor cavity 116.

Figure 5:
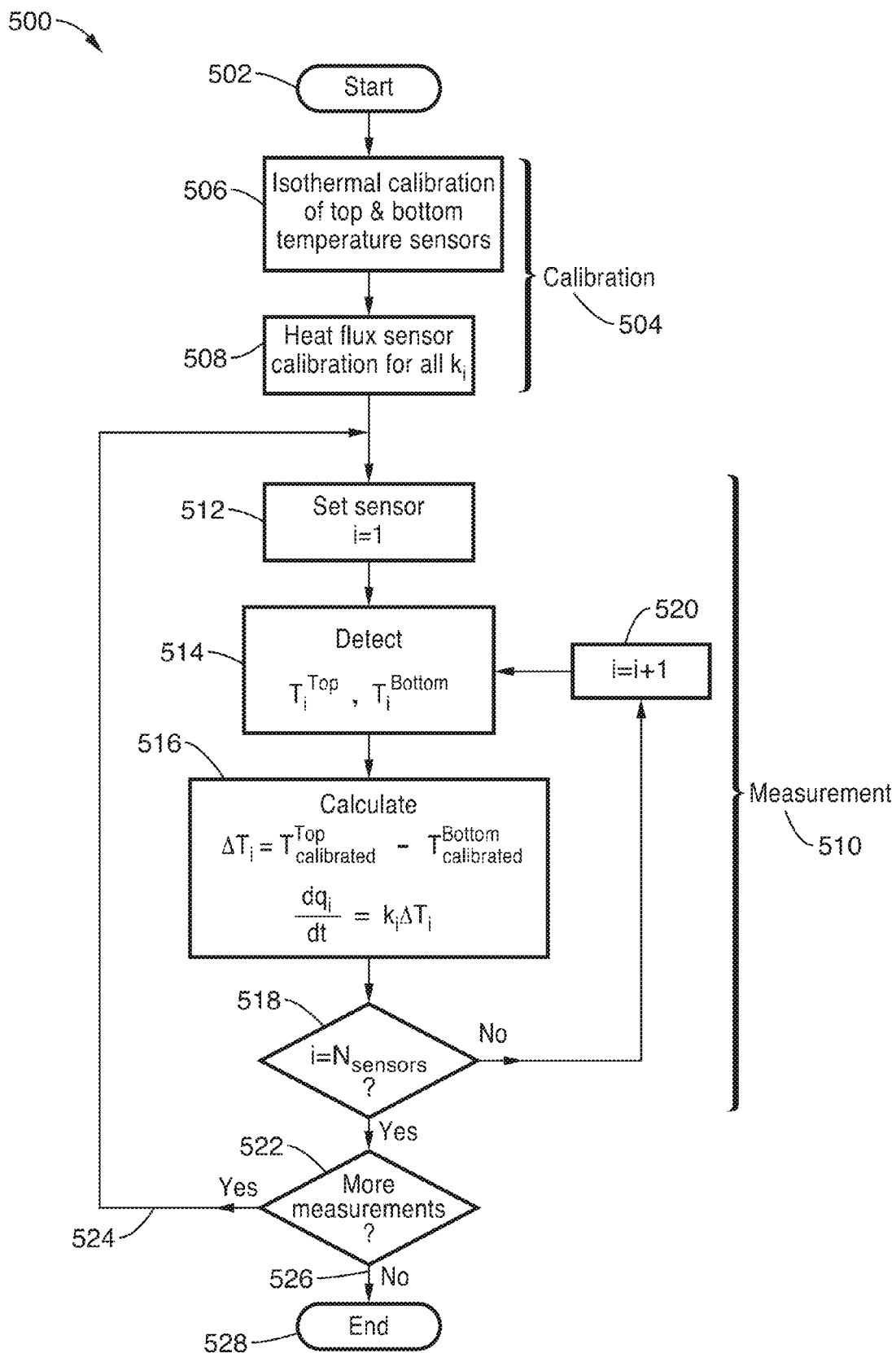
FIG. 5 is a flowchart addressing temperature sensor inaccuracies with detailed calibration steps, and corresponding heat flux calibrations, in accordance with one embodiment of the present invention.

FIG. 5 illustrates a flow chart 500 depicting steps in a calibration procedure of the measurement wafer heat flux sensor 101, in accordance with one embodiment of the present invention. It is noted herein that the steps of flow chart 500 are not to be interpreted as limiting and are provided merely for illustrative purposes.

In one embodiment, the process starts 502 with a group of calibration steps 504. In one embodiment, the process includes an isothermal calibration 506 of all of the top temperature sensors (e.g., sensor 108 and the like) and all of the bottom temperature sensors (e.g., sensor 110 and the like). It is noted herein that this step may be achieved by placing the measurement wafer heat flux sensor 101, described previously herein, into an isothermal chamber, and recording the calibration temperatures at each isothermal chamber temperature setting. In other embodiments, it is also possible to calibrate all sensors at one time by applying a heat flux across the entire substrate surface.

In another embodiment, once all of the temperature sensors are temperature calibrated, the heat flux may be calibrated in step 508 for all of the heat flux sensors (e.g., pairs of temperature sensors). It is noted herein that the heat flux calibrations may be carried out in a suitable test chamber where heat flux may be simulated and tested, resulting in a set of measured heat flux calibration factors relative to the input calibration fluxes.

It is further noted that, since all heat flux measurements in the heat flux sensor 101 utilize differential temperature measurements, the calibrated temperature offsets may be combined into differential calibration factors that are used to more accurately measure heat flux.

In another embodiment, the various temperature sensor calibration temperature offsets may be stored in a lookup table form, thereby providing data for various types of interpolation, splining, etc. for improved data measurement.

In another embodiment, once the measurement wafer heat flux sensor 101 has been calibrated with temperature calibration measurements and heat flux calibration factors, the corrections may be implemented to measure actual heat flux in the measurement section 510.

Starting by setting the $i^{th}$ heat flux sensor to 1 (in step 512), the top and bottom sensor temperatures, $T_i^{Top}$ and $T_i^{Bottom}$ are measured in step 514. In another embodiment, the calibrated temperature offsets for the $i^{th}$ heat flux sensor are used to calculate the $T_{calibrated}^{Top}$ and $T_{calibrated}^{Bottom}$ for the sensor. In another embodiment, in step 516, these calibrated measurements are then subtracted to form a calibrated differential temperature given by:

$$\Delta T_i = (T_i^{Top} - T_i^{Bottom})|_{calibrated} = T_{calibrated}^{Top} - T_{calibrated}^{Bottom}$$

In another embodiment, the heat flux passing through the region of the $i^{th}$ heat flux sensor $q_i$ is calculated by applying the heat flux calibration factor $k_i$ to the calibrated differential temperature $\Delta T_i$ by $q_i = k_i \Delta T_i$. In one embodiment, the heat flux calibration factor $k_i$ is shown to be a simple factor. In additional embodiments, the calibration factor may, in fact, contain additional complexity, incorporating one or more of polynomial coefficients, Gaussian interpolation points and the like. In another embodiment, the calibration factor $k_i$ may be temperature dependent.

In another embodiment, after the heat flux passing through the region of the $i^{th}$ heat flux sensor $q_i$ is calculated, a test 518 is made to see if the $i^{th}$ heat flux sensor is the last sensor of the $N_{sensors}$ set. If it is not the last sensor, then the $i^{th}$ heat flux sensor is incremented 520, and the next sensor is measured. If the $i^{th}$ heat flux sensor is in fact the last sensor of the $N_{sensors}$ set, then another test 522 is made to determine if another set of heat flux measurements should be made. If so, then the Yes branch 524 is taken looping back to take another set of measurements. If the measurements are concluded, then the No branch 526 is taken, and the measurement process ends 528.

The process above discussed the sequential usage of the temperature calibration factors and the heat flux calibration factors. It is recognized herein that these processes may be combined, so that a single function relating the input temperatures of the $T_i^{Top}$ and $T_i^{Bottom}$ may be used to calculate the calibrated output heat flux for the $i^{th}$ heat flux sensor.

Figure 6:
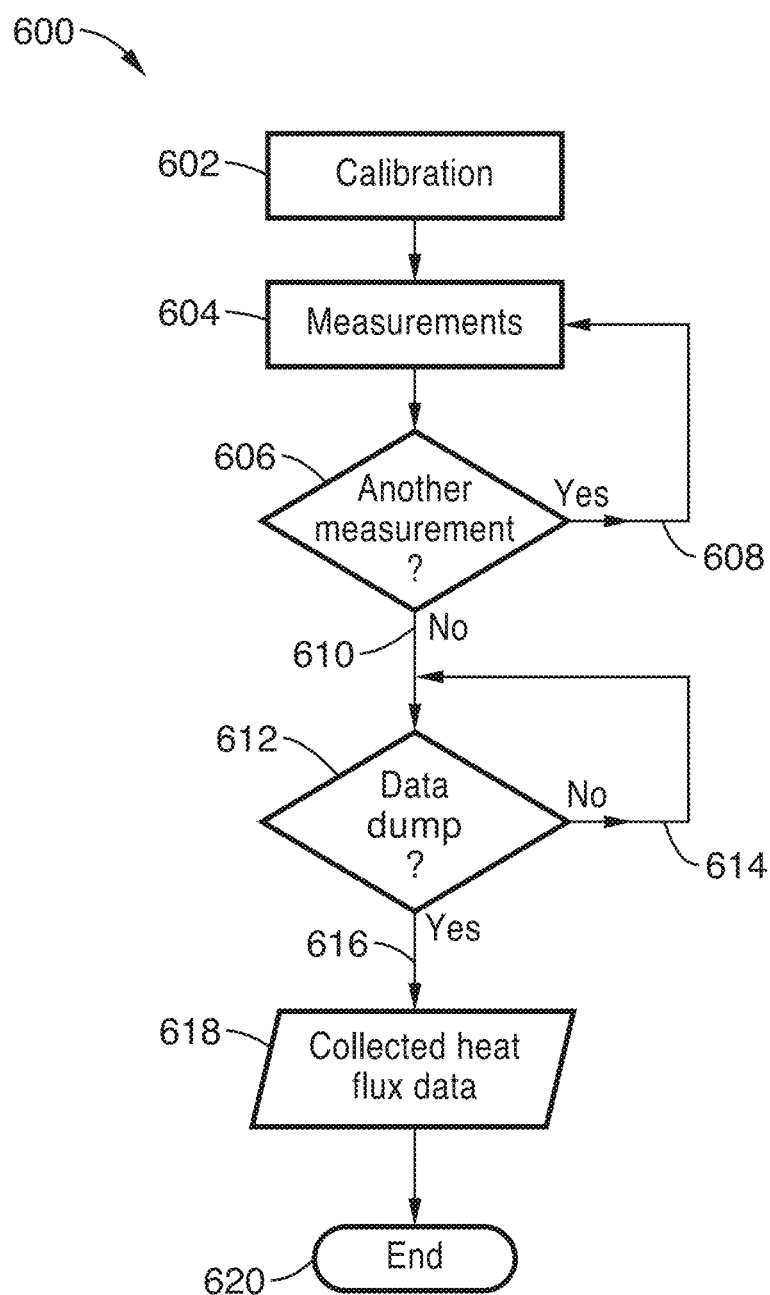
FIG. 6 is a flowchart depicting the operation of the heat flux system, indicating calibration, measurement, and data dump output steps, in accordance with one embodiment of the present invention.

FIG. 6 illustrates a flow chart 600 depicting the operation steps of the measurement wafer heat flux sensor 101, in accordance with one embodiment of the present invention. It is noted herein that the steps of flow chart 600 are not to be interpreted as limiting and are provided merely for illustrative purposes.

In one embodiment, a calibration step 602 is performed. For example, the calibration step 602 may include, but is not limited to, one or more of the calibration steps performed in process 500, described previously herein. In step 602, various temperature and heat flux calibration factors are collected. In another embodiment, after the calibration step 602, one or more measurements 604 are taken via one or more of the individual heat flux sensors (e.g., pairs of temperature sensors) of the measurement wafer heat flux sensor 101. In another embodiment, after a measurement is performed, a test may be carried out to determine if another measurement 606 should be taken. If Yes 608, then another measurement 604 is taken. In another embodiment, after all required measurements 604 have been performed, the No branch 610 is taken. In another embodiment, it is tested whether the accumulated data should be dumped 612. In one embodiment, the No branch 614 causes the flow to loop until the data is ready to be dumped. In another embodiment, if the data is ready to be dumped, then the Yes branch 616 is taken, and the collected heat flux data is output 618 and the process ends 620.

The herein described subject matter sometimes illustrates different components contained within, or connected with, other components. It is to be understood that such depicted architectures are merely exemplary, and that in fact many other architectures can be implemented which achieve the same functionality. In a conceptual sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermedial components. Likewise, any two components so associated can also be viewed as being "connected," or "coupled," to each other to achieve the desired functionality, and any two components capable of being so associated can also be viewed as being "couplable," to each other to achieve the desired functionality. Specific examples of couplable include, but are not limited to, physically interactable and/or physically interacting components and/or wirelessly interactable and/or wirelessly interacting components and/or logically interactable and/or logically interacting components.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes. Furthermore, it is to be understood that the invention is defined by the appended claims.

What is claimed:

1. A measurement wafer heat flux sensor comprising:
   a substrate;
   a cover thermally coupled to a portion of the substrate;
   a sensor cavity formed between the substrate and the cover;
   a thermal barrier disposed within at least a portion of the sensor cavity;
   a bottom temperature sensor thermally coupled to the substrate and insulated from the cover by a first portion of the thermal barrier; and
   a top temperature sensor thermally coupled to the cover and insulated from the substrate by an additional portion of the thermal barrier, wherein the first portion of the thermal barrier is contiguous with the additional portion of the thermal barrier,
   wherein a temperature difference between the bottom temperature sensor and the top temperature sensor is related to a heat flux passing through the substrate and cover proximate to the sensor cavity.

2. The measurement wafer heat flux sensor of claim 1, wherein the measurement wafer includes one or more sensor circuits providing one or more electrical connections to at least one of the bottom temperature sensor and the top temperature sensor.

3. The measurement wafer heat flux sensor of claim 2, wherein the thermal barrier includes one or more sensor circuits providing one or more electrical connections to at least one of the bottom temperature sensor and the top temperature sensor.

4. The measurement wafer heat flux sensor of claim 2, wherein the one or more sensor circuits include at least one of a flexible printed circuit at least partially disposed between the substrate and the cover, a substrate integrated circuit disposed at least partially on the substrate, a cover integrated circuit disposed at least partially on the cover and a multilayer flexible printed circuit at least partially disposed between the substrate and the cover.

5. The measurement wafer heat flux sensor of claim 1, wherein the substrate comprises:
   a substrate wafer.

6. The measurement wafer heat flux sensor of claim 1, wherein the cover comprises:
   a cover wafer.

7. The measurement wafer heat flux sensor of claim 1, wherein the thermal barrier comprises:
   a thermally insulating layer.

8. The measurement wafer heat flux sensor of claim 1, wherein the measurement wafer heat flux sensor is compatible with a plasma processing chamber.

9. A heat flux sensing system comprising:
   a measurement wafer heat flux sensor including:
      a substrate;
      a cover thermally coupled to a portion of the substrate;
      a sensor cavity formed between the substrate and the cover;
      a thermal barrier disposed within at least a portion of the sensor cavity;
      a bottom temperature sensor thermally coupled to the substrate and insulated from the cover by a first portion of the thermal barrier; and
      a top temperature sensor thermally coupled to the cover and insulated from the substrate by an additional portion of the thermal barrier, wherein the first portion of the thermal barrier is contiguous with the additional portion of the thermal barrier, wherein a temperature difference between the bottom temperature sensor and the top temperature sensor is related to a heat flux passing through the substrate and cover proximate to the sensor cavity;
   a controller communicatively coupled to the measurement wafer heat flux sensor, the controller including one or more processors configured to execute a set of program instructions, the set of program instructions configured to cause the one or more processors to:
      receive temperature measurements from the bottom temperature sensor and the top temperature sensor;
      determine the differential temperature between the top temperature sensor and the bottom temperature sensor; and determine a heat flux passing through the substrate and cover proximate to the sensor cavity based on the differential temperature between the bottom temperature sensor and the top temperature sensor.

10. The heat flux sensing system of claim 9, wherein the top temperature sensor and the bottom temperature sensor are positioned substantially perpendicular to a direction of thermal energy flow.

11. The heat flux sensing system of claim 9, wherein the thermal barrier comprises:
one or more thermally insulating layers.

12. The heat flux sensing system of claim 11, wherein the one or more thermally insulating layers comprise:
at least one of a thermal insulating film and a thermal insulating plate.

13. The heat flux sensing system of claim 9, wherein the controller is positioned on a portion of the substrate.

14. The heat flux sensing system of claim 9, wherein the controller is positioned remotely from the substrate.

15. The heat flux sensing system of claim 9, wherein the measurement wafer heat flux sensor is compatible with a plasma processing chamber.

16. The heat flux sensing system of claim 9, wherein the determining differential temperature between the top temperature sensor and the bottom temperature sensor comprises:
applying one or more differential calibration factors to the differential temperature to generate a calibrated differential temperature.

17. The heat flux sensing system of claim 9, wherein the determining the heat flux passing through the substrate and cover proximate to the sensor cavity comprises:
acquiring one or more calibration heat flux measurements via the top temperature sensor and the bottom temperature sensor;
generating one or more heat flux calibration factors from the acquired one or more calibration heat flux measurements; and
applying the generated one or more heat flux calibration factors to the differential temperature between the bottom temperature sensor and the top temperature sensor to determine the heat flux passing through the substrate and cover proximate to the sensor cavity.

18. The heat flux sensing system of claim 9, wherein the determining the heat flux passing through the substrate and cover proximate to the sensor cavity comprises:
applying one or more heat flux calibration factors to the differential temperature to determine the heat flux passing through the substrate and cover proximate to the sensor cavity.

19. The heat flux sensing system of claim 18, wherein the one or more heat flux calibration factors are temperature dependent.

20. The heat flux sensing system of claim 9, wherein the controller is further configured to:
isothermally calibrate the top temperature sensor and the bottom temperature sensor within a thermal calibration range to form one or more sensor calibrations for the measurement wafer heat flux sensor; and
applying the one or more sensor calibrations to temperatures detected from the bottom temperature sensor and top temperature sensor to form one or more heat flux calibration factors.

21. A method for measuring heat flux with a measurement wafer comprising:
providing a measurement wafer heat flux sensor including at least a bottom temperature sensor thermally coupled to a substrate and insulated from a cover by a first portion of the thermal barrier and at least a top temperature sensor thermally coupled to the cover and insulated from the substrate by an additional portion of the thermal barrier, wherein the first portion of the thermal barrier is contiguous with the additional portion of the thermal barrier, the bottom temperature sensor and the top temperature sensor disposed in a sensor cavity of the measurement wafer heat flux sensor;
acquiring temperature measurements from the bottom temperature sensor and the top temperature sensor of the measurement wafer heat flux sensor;
determining a differential temperature between the top temperature sensor and the bottom temperature sensor; and
determining a heat flux passing through the substrate and cover proximate to the sensor cavity based on the differential temperature between the bottom temperature sensor and the top temperature sensor.

22. The method of claim 21, further comprising:
determining one or more heat flux calibration factors.

23. The method of claim 22, wherein the one or more heat flux calibration factors are temperature dependent.

24. The method of claim 22, wherein the determining one or more heat flux calibration factors comprises:
isothermally calibrating the top temperature sensor and the bottom temperature sensor within a thermal calibration range to form one or more sensor calibrations for the measurement wafer heat flux sensor; and
applying the one or more sensor calibrations to temperatures detected from the bottom temperature sensor and top temperature sensor to form one or more heat flux calibration factors.

25. The method of claim 22, further comprising:
applying the one or more heat flux calibration factors to the differential temperature to determine the heat flux passing through the substrate and cover proximate to the sensor cavity.

* * * * *